United States Patent
Shiiki et al.

(10) Patent No.: US 6,762,551 B2
(45) Date of Patent: Jul. 13, 2004

(54) WHITE LIGHT SOURCE AND DISPLAY APPARATUS USING THE SAME

(75) Inventors: Masatoshi Shiiki, Musashimurayama (JP); Masaaki Komatsu, Kokubunji (JP); Choichiro Okazaki, Kodaira (JP); Shin Imamura, Kokubunji (JP); Teruki Suzuki, Funabashi (JP)

(73) Assignee: Hitachi, Ltd., Tokyo (JP)

( * ) Notice: Subject to any disclaimer, the term of this patent is extended or adjusted under 35 U.S.C. 154(b) by 65 days.

(21) Appl. No.: 10/096,574

(22) Filed: Mar. 14, 2002

(65) Prior Publication Data

US 2003/0155856 A1 Aug. 21, 2003

(30) Foreign Application Priority Data

Feb. 15, 2002 (JP) .................................... 2002-039097

(51) Int. Cl.[7] .............................. H01J 1/62; H01J 63/04
(52) U.S. Cl. ....................... 313/503; 313/502; 313/582; 313/483; 252/301.6 S; 252/301.4 S
(58) Field of Search ................................ 313/483–484, 313/502, 503, 498–512, 582–587; 252/301.6 S, 301.4 S, 301.4 R

(56) References Cited

U.S. PATENT DOCUMENTS

| | | | | |
|---|---|---|---|---|
| 3,965,031 A | * | 6/1976 | Klein et al. | 252/301.4 R |
| 4,374,037 A | * | 2/1983 | Takahashi | 252/301.4 S |
| 5,813,753 A | * | 9/1998 | Vriens et al. | 362/293 |
| 6,100,633 A | * | 8/2000 | Okumura et al. | 313/486 |
| 6,203,726 B1 | * | 3/2001 | Danielson et al. | 252/301.4 R |
| 6,294,800 B1 | * | 9/2001 | Duggal et al. | 257/89 |
| 6,458,295 B1 | * | 10/2002 | Yamada et al. | 252/301.4 R |
| 6,580,097 B1 | * | 6/2003 | Soules et al. | 257/100 |

FOREIGN PATENT DOCUMENTS

| | | |
|---|---|---|
| JP | 52-3627 | 6/1976 |
| JP | 54-34710 | 8/1977 |
| JP | 10-269822 | 9/1995 |
| JP | 10-140150 | 11/1996 |

* cited by examiner

Primary Examiner—Ashok Patel
Assistant Examiner—German Colón
(74) Attorney, Agent, or Firm—Reed Smith LLP; Stanley P. Fisher, Esq.; Juan Carlos A. Marquez, Esq.

(57) ABSTRACT

A white light source includes an ultraviolet-visible excitation light generation unit capable of generating visible light and ultraviolet light, and a fluorescence generation unit having a phosphor layer and being capable of generating visible light upon excitation by the ultraviolet light and uses, in the phosphor layer, a red light emitting phosphor represented by the following compositional formula: $(Ca_{1-a-b}Sr_aEu_b)S:M_c$, wherein a, b and c satisfy the following conditions: $0 \leq a < 1.0$, $0 \leq b < 0.1$ and $0 \leq c \leq 0.1$; and M is a dopant element having absorption of excitation energy at about 350 nm to about 500 nm. The dopant element M includes rare earth elements such as Ce, Yb, Gd and Tm. By substituting part of Ca and/or Sr with Zn, the white light source can exhibit further improved performances. The white light source exhibits an increased red light component as compared with light emitted from conventional $(Y_{1-a-b}Gd_aCe_b)_3(Al_{1-c}Ga_c)_5O_{12}$ green light phosphors and is suitably used in display apparatus.

14 Claims, 6 Drawing Sheets

WHITE LIGHT { BLUE LIGHT (BLUE-LED) + YELLOW-GREEN LIGHT (YAG:Ce PHOSPHOR)

PHOSPHOR LAYER
(RED/GREEN STRIPE LAYER)

WHITE LIGHT SOURCE AND DISPLAY APPARATUS USING THE SAME

BACKGROUND OF THE INVENTION

1. Field of the Invention

The present invention relates to a white light source and a display apparatus using the white light source. Specifically, it relates to a high-quality white light source that is suitable as a light source of display apparatus and to a display apparatus using the white light source.

2. Description of the Related Art

Liquid crystal displays comprising liquid crystals as display panels have practically been used as display apparatus. Such liquid crystal displays essentially require light sources (back-lights) to display color images on the liquid crystals.

Demands have recently been made on further miniaturized and higher-quality light sources. To improve image quality of such liquid displays as display apparatus, white light emitted from the light sources must have further improved quality. To improve image quality and to increase luminance, the light sources must have optimized white-light temperature, improved luminance saturation, luminance degradation and decay characteristics.

One of these white light sources is a light source comprising a phosphor screen and an ultraviolet-visible light emitting lamp such as a blue light emitting diode (blue-LED) that is capable of exciting a phosphor screen and allowing the same to emit a first visible light component and is capable of emitting a second visible light component. This light source yields white light by mixing these visible light components.

The luminance saturation and luminance degradation of the light sources using phosphor screen significantly vary depending on the type, production method, dopants (impurities) and composition of phosphor materials. To improve these characteristics, a phosphor having improved characteristics has been selected or the composition and production method of such a phosphor have been improved. However, no conventional single phosphor material has sufficiently satisfied all the required characteristics.

To reduce the aforementioned disadvantages, a $Y_3(Al,Ga)_5O_{12}$:Ce phosphor exhibiting less luminance degradation has been used. This phosphor emits yellowish green light and yields white light by mixing the green light with a blue light component emitted from an excitation light source for allowing the phosphor to emit light. However, this phosphor cannot yield a sufficient color temperature.

Accordingly, the phosphor has deteriorated reproducibility as a phosphor for white light sources and cannot be used alone as a phosphor in display apparatus (see, for example, Japanese Published

SUMMARY OF THE INVENTION

Accordingly, an object of the present invention is to solve the above problems and to provide a high-quality white light source capable of emitting an increased red light component in addition to luminous colors of the conventional $Y_3(Al, Ga)_5O_{12}$: Ce green light phosphor used in such light sources, as well as to provide a display apparatus using the white light source.

To achieve the above and other objects, the present invention provides, in an aspect, a white light source including an ultraviolet-visible excitation light generation unit capable of generating ultraviolet light and first visible light of wavelength of from 400 nm to 500 nm, and a fluorescence generation unit having a phosphor layer and being capable of generating second visible light upon irradiation of ultraviolet-visible light generated from the ultraviolet-visible excitation light generation unit as excitation light. The white light source yields white light by mixing the first visible light from the ultraviolet-visible excitation light generation unit and the second visible light from the fluorescence generation unit. In the white light source, the phosphor layer includes a red light emitting phosphor represented by following Compositional Formula (1):

$(Ca_{1-a-b}Sr_aEu_b)S:M_c$     (1)

wherein a, b and c satisfy the following conditions:

$0 \leq a < 1.0$, $0 < b \leq 0.1$ and $0 \leq c \leq 0.1$;

and M is a dopant element having an absorption of excitation energy in a range from about 350 nm to about 500 nm. The element M may be at least one rare earth element selected from Ce, Yb, Gd and Tm.

Part of Ca and/or Sr in Compositional Formula (1) may be substituted by Zn. In this case, the red light emitting phosphor is represented by following Compositional Formula (2):

$(Ca_{1-a-b-d}Sr_aZn_dEu_b)S:M_c$     (2)

wherein a, b, c and M are as defined above; and d satisfies the following condition: $0.01 \leq d \leq 0.1$.

The phosphor layer of the fluorescence generation unit may further include a magnesium fluorogermanate phosphor in addition to the red light emitting phosphor represented by Compositional Formula (1) or (2).

The phosphor layer of the fluorescence generation unit may further include a green light emitting phosphor represented by following Compositional Formula (3):

$(Y_{1-a-b}Gd_aCe_b)_3(Al_{1-c}Ga_c)_5O_{12}$     (3)

wherein a, b and c satisfy the following conditions: $0 \leq a \leq 1.0$, $0 < b \leq 0.1$ and $0 \leq c \leq 1.0$, in addition to the red light emitting phosphor represented by Compositional Formula (1) or (2). The content of the green light emitting phosphor is preferably from about 40% to about 80% by weight based on the total weight of phosphors constituting the phosphor layer.

The phosphor represented by Compositional Formula (3) preferably further includes K (potassium) as a dopant (an impurity). The green light emitting phosphor in this case is represented by following Compositional Formula (4):

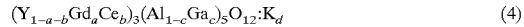

$(Y_{1-a-b}Gd_aCe_b)_3(Al_{1-c}Ga_c)_5O_{12}:K_d$     (4)

wherein a, b and c satisfy the following conditions: $0 \leq a \leq 1.0$, $0 < b \leq 0.1$ and $0 \leq c \leq 1.0$; K is contained as a dopant; and d is ppm by weight and satisfies the following condition: $0 \leq d \leq 1000$ The content of the green light emitting phosphor represented by Compositional Formula (4) is preferably from about 40% to about 80% by weight based on the total weight of phosphors constituting the phosphor layer.

The monovalent metal element M as a dopant can be introduced into the phosphor represented by Compositional Formula (1) or (2) by adding a predetermined amount of a sulfate or borate of M, such as potassium sulfate or sodium borate, as a flux to the phosphor upon synthesis thereof. Among these fluxes, potassium sulfate is typically preferred.

In the green light emitting phosphor represented by Compositional Formula (3) or (4), the ratio of the X-ray diffraction peak intensity of $GdAlO_3$ in the (211) orientation to that of the green light emitting phosphor represented by Compositional Formula (3) or (4) in the (420) orientation may be less than or equal to one fifth in the determination of X-ray diffraction peak intensity using $K\alpha$ characteristic X-ray of Cu.

The ultraviolet-visible excitation light generation unit of the light source includes, for example, an excitation light source that emits a visible light component and an ultraviolet light component, such as an ultraviolet light lamp, blue-flourescent lamp or a gallium nitride (GaN) blue light emitting diode (hereinafter briefly referred to as "blue-LED") having a luminous peak in a range from about 350 nm to about 460 nm. The phosphor layer constituting the fluorescence generation unit is preferably formed so as to cover at least a light emitting surface of the excitation light source.

In another aspect, the present invention provides a display apparatus having a light source. The light source includes a fluorescence generation unit having a phosphor layer and being capable of generating visible light, and an excitation light generation unit capable of irradiating the phosphor layer with excitation light and allowing the phosphor layer to generate visible light, in which the light source is the white light source of the present invention.

One of the features of the display apparatus of the present invention is the aforementioned white light source. Preferred configurational embodiments of the display apparatus will be illustrated below.

Specifically, the display apparatus preferably includes a display panel, the light source and a control device capable of controlling visible light irradiated by the light source to thereby display an image on the display panel, in which the light source has a control device capable of controlling change in emission intensity of one of red, green and blue light with time to thereby control changes in emission intensities of the red, green and blue light with time.

In the display apparatus just mentioned above, the white light source further preferably has a control device capable of controlling a change in emission intensity of the blue light emission of the blue-light discharge lamp constituting the excitation light generation unit of the white light source to thereby control changes in emission intensities of red, green and blue light with time.

The display apparatus of the present invention is preferably applied to a display apparatus including a liquid crystal display panel. In this case, the display apparatus includes a liquid crystal display panel, a light source constituting a back-light of the liquid crystal display panel, and a control device allowing the liquid crystal display panel to display image information. In this display apparatus, the light source constituting the back-light includes the white light source of the present invention.

The display apparatus may include a fluorescence generation unit having a phosphor layer and being capable of generating visible light, and an excitation light generation unit capable of irradiating the phosphor layer with excitation light and allowing the phosphor layer to emit light, in which the phosphor layer includes a mixture of any materials of the red light emitting phosphor and the green light emitting phosphor.

In addition, the present invention provides a display apparatus including a fluorescence generation unit having a phosphor layer and being capable of generating visible light, and an excitation light generation unit capable of irradiating the phosphor layer with excitation light and allowing the phosphor layer to emit light, in which the excitation light generation unit includes a blue light emitting discharge lamp as an excitation light source, and the fluorescence generation unit has a phosphor layer including the red light emitting phosphor layer and a green light emitting phosphor layer separately disposed adjacent to each other.

Further objects, features and advantages of the present invention will become apparent from the following description of the preferred embodiments with reference to the attached drawings.

Figure 1:
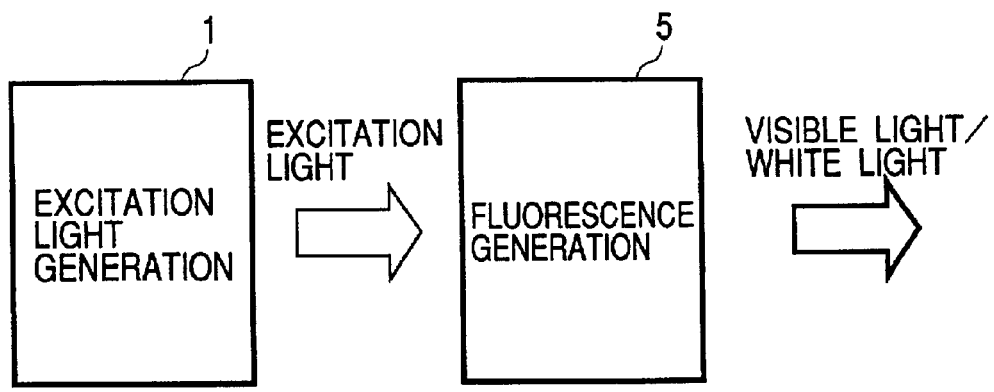
FIG. 1 is schematic diagram showing the configuration of a white light source as an embodiment of the present invention.

In these figures, the reference numerals are: 1: excitation light generation unit, 2: light diffusion layer, 3,4: power supply terminal, 5: fluorescence generation unit (phosphor layer), 6: light source, 7: liquid crystal display panel (LCD panel), 7a: liquid crystal plate, 7b: filter (color filter layer; CF layer)

DETAILED DESCRIPTION OF THE PREFERRED EMBODIMENTS

The present invention will be described in further detail with reference to several embodiments and comparative examples below and the attached drawings, which are not intended to limit the scope of the invention.

First Embodiment

Synthesis of Red Light Emitting Phosphor

To 1 mole of the total of CaS, SrS, EuS or $Eu_2O_3$, and $Ce_2(C_2O_4)_3$ as starting materials of a phosphor, 0.01 mole of sodium chloride as a flux component and 0.5 mole of $CS_2$ to make sulfur excess were added, the resulting mixture was placed in an opaque quartz crucible, followed by covering the crucible with a lid, and the mixture was baked at 1100° C. in a reducing atmosphere or in an atmosphere of trace amount of hydrogen sulfide for 2 hours. In this connection, the flux is not specifically limited to sodium chloride.

The baked product was sufficiently rinsed with water to remove the flux component, was then dried and thereby yielded a powdered phosphor represented by Compositional Formula (1) wherein a=0.5, b=0.05 and c=0.05. This phosphor emits red light upon excitation induced by UV light irradiation.

Synthesis of Yellow-Green Light Emitting Phosphor

To 1 mole of the total of $Y_2O_3$, $Gd_2O_3$, $Ce_2(C_2O_4)_3.9H_2O$, $Al_2O_3$ and $Ga_2O_3$ as starting materials of a phosphor, 0.5 mole of potassium sulfate as a flux component was added, the resulting mixture was placed in an alumina crucible, followed by covering the crucible with a lid, and the mixture was then baked at 1600° C. in an atmosphere of air for 3 hours.

The baked product was sufficiently rinsed with water to remove the flux component, was then dried and thereby yielded a powdered phosphor represented by Compositional Formula (4): $(Y_{0.1}Gd_{0.89}Ce_{0.01})_3Al_2Ga_3O_{12}$:K The content of potassium K in the phosphor was 150 ppm by weight. The potassium content is preferably at most 1000 ppm by weight. This phosphor emits yellow-green light upon excitation induced by UV irradiation.

Assembly of Light Source

The two powdered phosphors were dispersed in a binder, the resulting slurry was uniformed applied onto a plastic substrate, was subjected to distillation at low temperatures to remove the solvent and thereby yielded a phosphor layer. In this procedure, the weight ratio of the red light emitting phosphor to the yellow-green light emitting phosphor was about 4:6.

The phosphor layer was then assembled with a UV light lamp, blue-fluorescent lamp, or an UV- or blue-LED as an excitation light source to excite the phosphor and thereby yielded light sources.

Power was then supplied to the excitation light source to thereby generate excitation light, and upon excitation, the phosphor layer emitted red light in addition to yellow-green light. White light was observed when the blue-fluorescent lamp and the blue-LED were used in combination.

FIG. 1 is a schematic diagram of a white light source according to the present invention. The white light source includes an excitation light generation unit 1 and a fluorescence generation unit 5. The excitation light generation unit 1 is capable of generating first visible light and excitation light (UV light) to excite a phosphor, and the fluorescence generation unit 5 is capable of generating second visible light (yellow-green light and red light) upon excitation by the excitation light.

Figure 2:
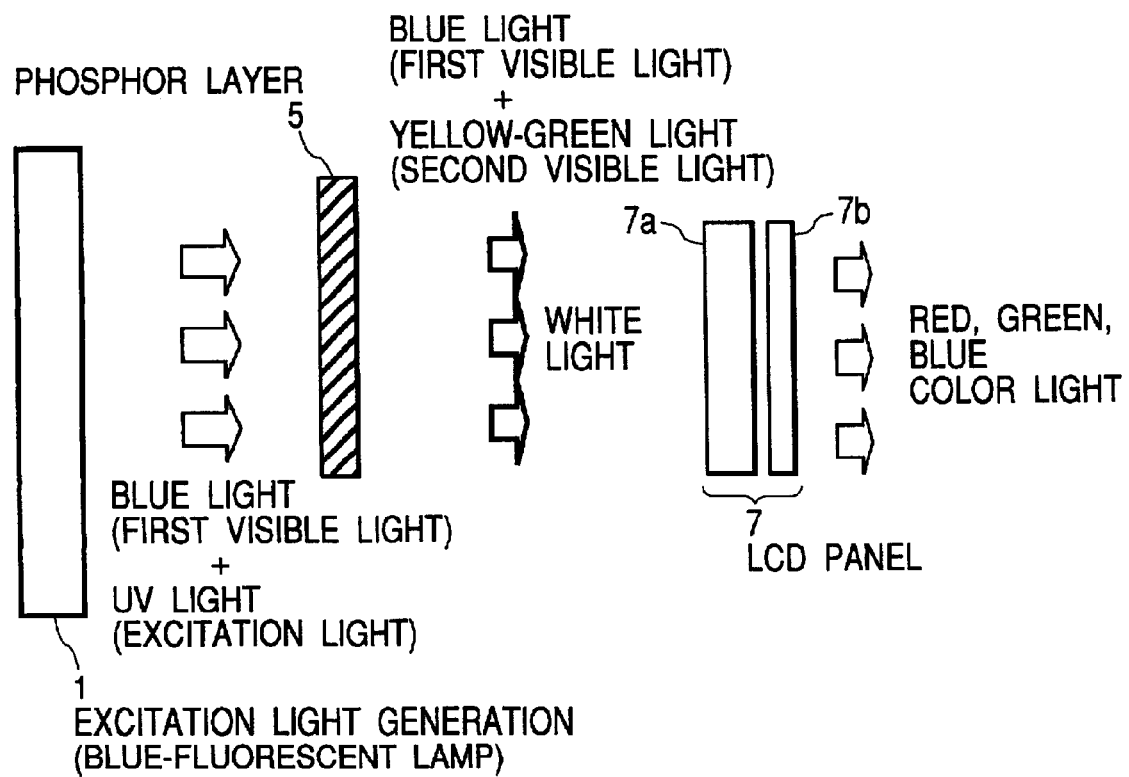
FIG. 2 is a schematic diagram showing the configuration of a liquid crystal display apparatus using the white light source of FIG. 1, in which an excitation light generation unit of the white light source is a blue-fluorescent lamp.

FIG. 2 is a block diagram showing an example of the configuration of a liquid crystal display apparatus, in which a light source comprises a blue-fluorescent lamp as the excitation light generation unit 1 and the aforementioned phosphor layer as the fluorescence generation unit 5. The back side of a liquid crystal display panel (LCD panel) 7 is irradiated with white light generated from the light source. The LCD panel 7 includes a liquid crystal plate 7a on the side of incident light (on the left side in the figure) and a filter (CF layer) 7b on the side of outgoing light (on the right side in the figure).

Figure 3:
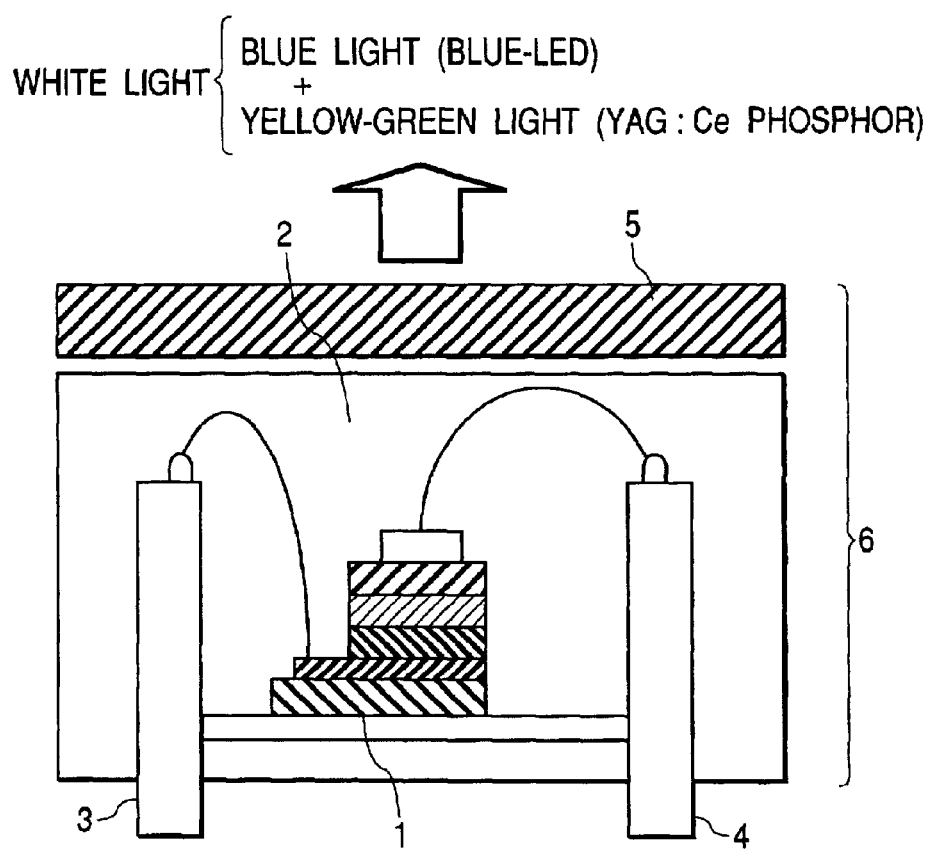
FIG. 3 is a schematic sectional view showing the configuration of the white light source of FIG. 1, which includes a blue-LED as an excitation light generation unit.

FIG. 3 is a schematic sectional view showing the configuration of a white light source 6 which includes a blue-LED as the excitation light generation unit 1. The white light source 6 comprises the blue-LED 1, a light diffusion layer 2, power supply terminals 3 and 4, and a fluorescence generation unit 5. The blue-LED constitutes the excitation light generation unit 1 and serves to emit first visible light (blue light) and UV light to excite the phosphor.

Figure 4:
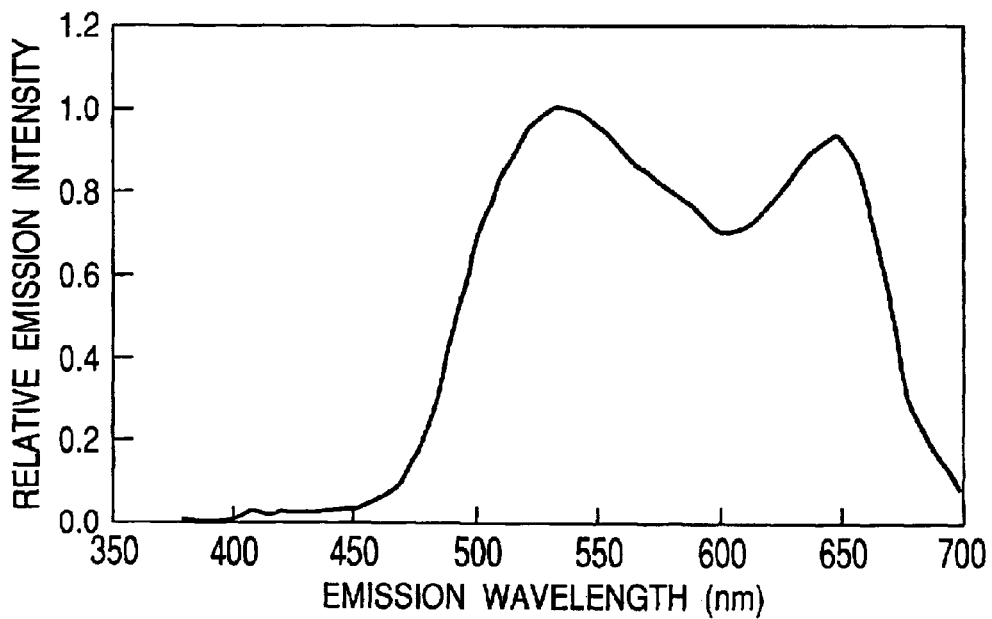
FIG. 4 is a diagram showing the emission spectrum of the phosphor in the fluorescence generation unit of the light source shown in FIG. 3.
Figure 5:
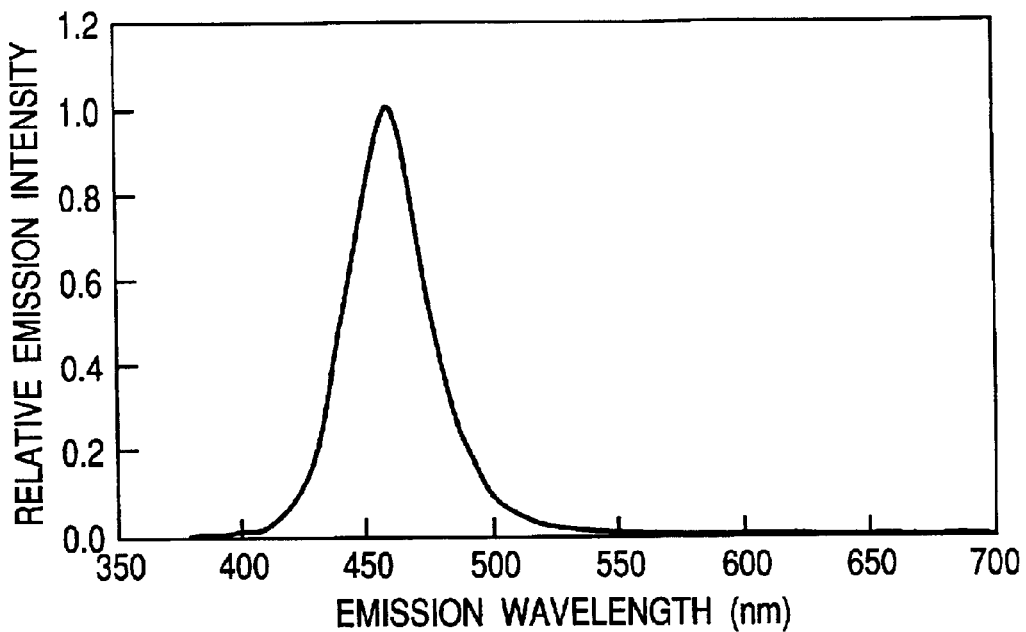
FIG. 5 is a diagram showing the emission spectrum of the blue-LED used in the excitation light generation unit of the white light source of FIG. 3.

FIG. 4 shows the emission spectrum of the phosphor in the fluorescence generation unit 5, and FIG. 5 shows the emission spectrum of the blue-LED.

Figure 6:
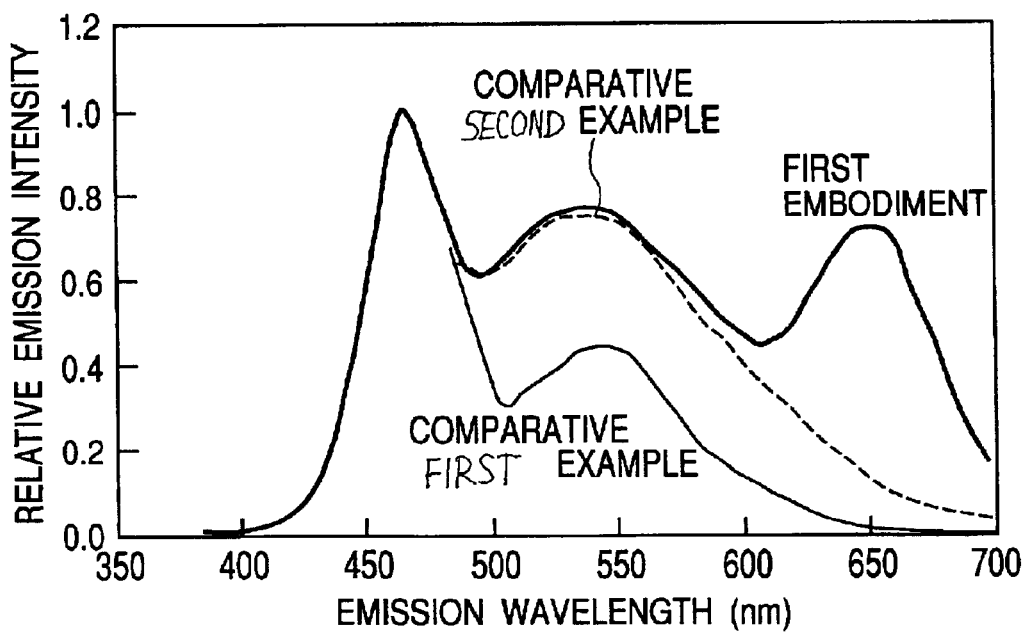
FIG. 6 is a diagram showing the emission spectra of white light sources in First Embodiment and Comparative First and Second Examples.

FIG. 6 shows the emission spectrum of a white light source in which the emission spectrum of the phosphor in FIG. 4 and that of the blue-LED in FIG. 5 are synthesized.

COMPARATIVE FIRST EXAMPLE

A phosphor represented by Compositional Formula (3): $(Gd_{0.99}Ce_{0.01})_3Al_2Ga_3O_{12}$ was baked in the same manner using the same materials as in the yellow-green light emitting phosphor in First Embodiment, except that no flux component was used, and using the resulting phosphor, a phosphor layer was prepared. The emission characteristics upon excitation of the blue-LED were determined in the same manner as in First Embodiment. The result is shown in FIG. 6.

COMPARATIVE SECOND EXAMPLE

A phosphor was prepared in the same manner as in Comparative First Example, except that 0.2 mole of barium fluoride as a flux component was added to 1 mole of the phosphor materials. The emission characteristics upon excitation of the blue-LED were determined in the same manner as in First Embodiment. The result is shown in FIG. 6.

FIG. 6 shows that the phosphor of First Embodiment obtained by baking with a flux exhibits a significantly higher emission intensity than one obtained without the use of flux (Comparative First Example). The phosphor of First Embodiment emits an increased red light component, as it includes the red light emitting phosphor represented by Compositional Formula (1) according to the present invention.

Second Embodiment

To verify a preferred range of the Sr content a, a series of phosphors represented by Compositional Formula (1): $(Ca_{1-a-b}Sr_aEu_b)S:M_c$, wherein a, b and c satisfy the following conditions: $0 \leq a < 1.0$, $0 < b \leq 0.1$ and $0 \leq c \leq 0.1$, were prepared in the same manner as in First Embodiment, except that the Eu content b was fixed at 0.05 and the Sr content a was varied within the range of from 0 to 1. The resulting phosphors had compositions as shown in Table 1.

TABLE 1

| Sample Number | Compositional Formula |
| --- | --- |
| 1 | $Ca_{0.95}S:Eu_{0.05}$ |
| 2 | $Ca_{0.9}Sr_{0.05}S:Eu_{0.05}$ |
| 3 | $Ca_{0.7}Sr_{0.25}S:Eu_{0.05}$ |
| 4 | $Ca_{0.5}Sr_{0.45}S:Eu_{0.05}$ |
| 5 | $Ca_{0.2}Sr_{0.75}S:Eu_{0.05}$ |
| 6 | $Ca_{0.1}Sr_{0.85}S:Eu_{0.05}$ |
| 7 | $Sr_{0.95}S:Eu_{0.05}$ |

Using the above-prepared phosphors having different compositions represented by Compositional Formula (1), a series of phosphor layers were prepared. The excitation light emission characteristics of the phosphor layers were determined using the blue-LED that was used in First Embodiment and had the emission spectrum shown in FIG. 5.

In this procedure, the light source 6 having the configuration shown in FIG. 3 was used, where the blue-LED 1 and the phosphor layer 5 were separately disposed.

As a result, a sufficient emission intensity was obtained at each Sr content a. However, when the Sr content a exceeds 0.9, the resulting phosphor exhibited an emission peak (emission wavelength) at a shorter wavelength than that of conventional red light phosphors for lamps and yielded insufficient redness. Accordingly, the Sr content a is preferably equal to or more than 0 and less than or equal to 0.9.

Figure 7:
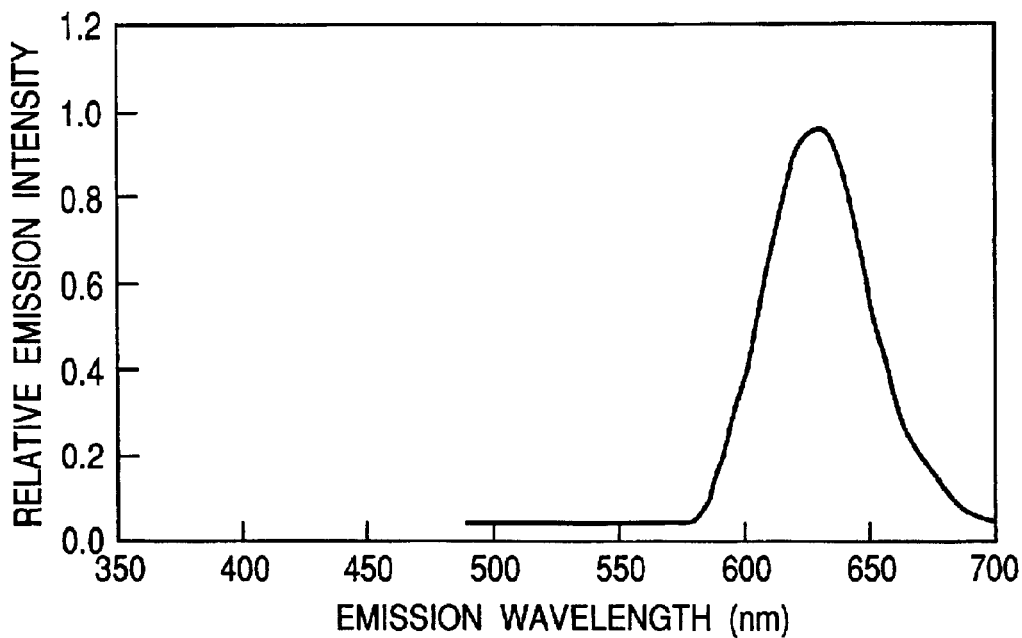
FIG. 7 is a diagram showing the emission spectrum of a red-fluorescence generation unit as an embodiment of the present invention.

FIG. 7 is the emission spectrum of typical red light phosphors according to the present invention (phosphors represented by $Ca_{0.95}S:Eu_{0.05}$ and $Ca_{0.1}Sr_{0.85}S:Eu_{0.05}$). FIG. 7 shows that the white light source of the present invention emitted white light containing a sufficient red light component.

Third Embodiment

To verify a preferred range of the Eu content b, a series of phosphors represented by Compositional Formula (1): $(Ca_{1-a-b}Sr_aEu_b)S:M_c$, wherein a, b and c satisfy the following conditions: $0 \leq a < 1.0$, $0 < b \leq 0.1$ and $0 \leq c \leq 0.1$, were prepared in the same manner as in First Embodiment, except that the Sr content a was fixed at 0 and the Eu content b was varied within the range of $0 < b \leq 0.1$.

Using the above-prepared phosphors having different compositions represented by Compositional Formula (1), a series of phosphor layers were prepared. The excitation light emission characteristics of the phosphor layers were determined using the blue-LED that was used in First Embodiment and had the emission spectrum shown in FIG. 5.

In this procedure, the light source 6 having the configuration shown in FIG. 3 was used, where the blue-LED 1 and the phosphor layer constituting the fluorescence generation unit 5 were separately disposed.

The results show that the Eu content b significantly affects the emission intensity and is effectively more than 0 and less than or equal to 0.1, and optimally equal to or more than 0.005 and less than or equal to 0.01. The resulting light source emitted white light including a sufficient red light component.

Fourth Embodiment

To verify a preferred range of the Ce dopant content c, a series of phosphors represented by Compositional Formula (1): $(Ca_{1-a-b}Sr_aEu_b)S:M_c$, wherein a, b and c satisfy the following conditions: $0 \leq a < 1.0$, $0 < b \leq 0.1$ and $0 \leq c \leq 0.1$, were prepared in the same manner as in First Embodiment, except that the Sr content a was fixed at 0, the Eu content b was fixed at 0.05 and the Ce dopant content c was varied within the range of $0 \leq c \leq 0.1$.

Using the above-prepared phosphors having different compositions represented by Compositional Formula (1), a series of phosphor layers were prepared. The excitation light emission characteristics of the phosphor layers were determined using the blue-LED that was used in First Embodiment and had the emission spectrum shown in FIG. 5.

In this procedure, the light source 6 having the configuration shown in FIG. 3 was used, where the blue-LED 1 and the phosphor constituting the phosphor layer 5 were separately disposed.

The results show that the Ce dopant content c significantly affects the emission intensity and is effectively equal to or more than 0 and less than or equal to 0.1, and optimally equal to or more than 0.001 and less than or equal to 0.01. The resulting light source emitted white light including a sufficient red light component. The use of Yb, Tm, Gd, Sb or other dopants showed similar advantages as in the use of Ce.

Fifth Embodiment

To verify a preferred range of the substituted content d, a series of phosphors represented by Compositional Formula (1): $(Ca_{1-a-b}Sr_aEu_b)S:M_c$, wherein a, b and c satisfy the following conditions: $0 \leq a < 1.0$, $0 < b \leq 0.1$ and $0 \leq c \leq 0.1$, were prepared in the same manner as in First Embodiment, except that the Sr content a was fixed at 0.1, the Eu content b was fixed at 0.05, part of Ca was substituted by Zn, and the Zn-substituted content of Ca d was varied within the range of $0 \leq d \leq 0.5$. The resulting phosphors were represented by Compositional Formula (2): $(Ca_{1-a-b-d}Sr_aZn_dEu_b)S:M_c$, wherein d is a Zn-substituted content.

Using the above-prepared phosphors having different compositions represented by Compositional Formula (2), a series of phosphor layers were prepared. The excitation light emission characteristics of the phosphor layers were determined using the blue-LED that was used in First Embodiment and had the emission spectrum shown in FIG. 5.

In this procedure, the light source 6 having the configuration shown in FIG. 3 was used, where the blue-LED 1 and the phosphor layer constituting the fluorescence generation unit 5 were separately disposed.

The results show that the Zn-substituted content d significantly affects the emission intensity and is optimally equal to or more than 0.01 and less than or equal to 0.1. The resulting light source emitted white light including a sufficient red light component. Similar advantages were obtained by substituting Ca with Mg, Ba or another element instead of Zn.

Sixth Embodiment

A phosphor layer was prepared by using an manganese-doped magnesium fluorogermanate phosphor as a red light emitting phosphor having a higher color purity in addition to the red light emitting phosphor and the yellow-green light emitting phosphor used in First Embodiment. When these three powdered phosphors were dispersed in a binder, the weight ratio of the (red light phosphor):(yellow-green light phosphor):(magnesium fluorogermanate phosphor) was set at 2:6:2.

The resulting slurry was homogeneously applied onto a plastic substrate, was subjected to distillation at low temperatures to remove the solvent and thereby yielded a phosphor layer.

The above-prepared phosphor layer was then assembled with a blue-fluorescent lamp as an excitation light source in the same manner as in First Embodiment and thereby yielded a light source. Power was then supplied to the excitation light source to generate excitation light. As a result, the phosphor layer emitted red light having a high color purity in addition to yellow-green light. The light source thereby yielded white light including a sufficient red color component.

Figure 8:
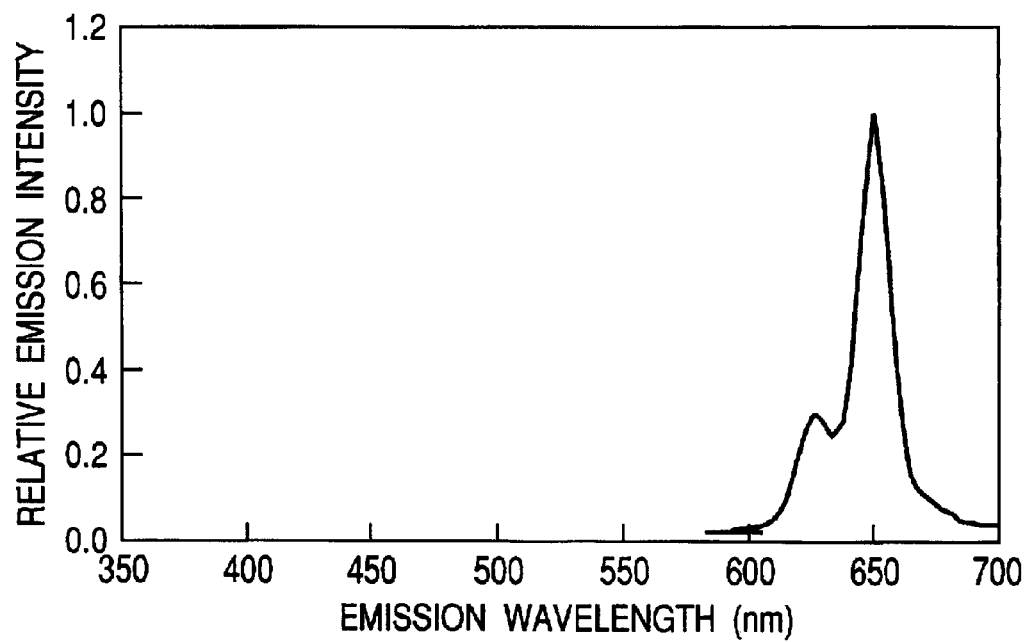
FIG. 8 a diagram showing the emission spectrum of a red-fluorescence generation unit as another embodiment of the present invention.

FIG. 8 shows the emission spectrum of the manganese-doped magnesium fluorogermanate phosphor. The manganese-doped magnesium fluorogermanate phosphor is represented by the compositional formula of $3.5MgO \cdot 0.5MgF_2—GeO_2:Mn$.

Seventh Embodiment

A phosphor layer was prepared using an $Al_2O_3:Cr$ phosphor as a red light phosphor having a higher color purity in addition to the red light emitting phosphor and the yellow-green light emitting phosphor used in First Embodiment. When these three powdered phosphors were dispersed in a binder, the weight ratio of the (red light phosphor):(yellow-green light phosphor):($Al_2O_3$:Cr phosphor) was set at 2:6:2. The resulting slurry was homogeneously applied onto a plastic substrate, the solvent was removed by distillation at low temperatures and thereby yielded a phosphor layer. The above-prepared phosphor layer was then assembled with a blue-fluorescent lamp as an excitation light source and thereby yielded a light source in the same manner as in Sixth Embodiment.

Power was then supplied to the excitation light source to generate excitation light. As a result, the phosphor layer emitted red light having a high color purity in addition to yellow-green light, and the light source thereby yielded white light including a sufficient red color component.

Figure 9:
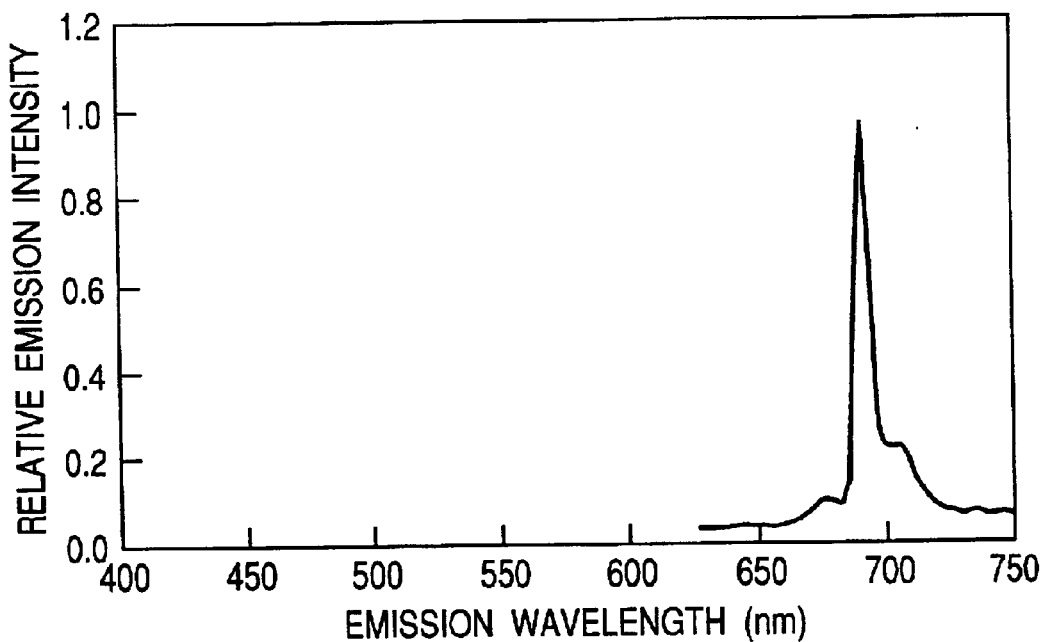
FIG. 9 a diagram showing the emission spectrum of a red-fluorescence generation unit as yet another embodiment of the present invention.

FIG. 9 shows the emission spectrum of the $Al_2O_3$:Cr phosphor.

Eighth Embodiment and Comparative Second Embodiment

A series of phosphors having a composition of $(Gd_{0.99}Ce_{0.01})_3Al_2Ga_3O_{12}$ was prepared by baking $Cd_2O_3$, $Ce_2(C_2O_4)_3 \cdot 9H_2O$, $Al_2O_3$ and $Ga_2O_3$ as oxide materials in the same manner as in First Embodiment with a flux component potassium sulfate (Eighth Embodiment) or barium fluoride $BaF_2$ (Comparative Second Example. Using the above-prepared phosphors, phosphor layers were prepared. In this procedure, 0.5 mole of potassium sulfate was added, and the resulting phosphor had a potassium content of 150 ppm by weight. Separately, a total of one hundredth mole to 2 moles of each flux was added to 1 mole of the product of the materials.

The phosphor layers were subjected to determination of X-ray diffraction intensity patterns using $K\alpha$ characteristic X-ray of Cu. As a result, the phosphor using $BaF_2$ as the flux showed a diffraction line of $GdAlO_3$ as an out-of-phase component. In contrast, the phosphor using potassium sulfate as the flux showed almost no diffraction line of $GdAlO_3$.

Specifically, the phosphor layer according to Comparative Second Example exhibited the diffraction line of $GdAlO_3$ in the (211) orientation at an intensity of about one fifth that of $(Gd_{0.99}Ce_{0.01})_3Al_2Ga_3O_{12}$ in the (420) orientation. In contrast, the phosphor layer according to Eighth Embodiment exhibited no diffraction line of $GdAlO_3$ in the (211) orientation, although it exhibited the diffraction line of $(Gd_{0.99}Ce_{0.01})_3Al_2Ga_3O12$ in the (420) orientation at almost the same intensity as that in Comparative Second Example. Even when the amount of potassium sulfate as the flux component was varied within the range of from one hundredth mole to 2 moles relative to 1 mole of the phosphor materials, the intensity ratio of the diffraction line of $GdAlO_3$ in the (211) orientation to that of $(Gd_{0.99}Ce_{0.01})_3Al_2Ga_3O_{12}$ in the (420) orientation was always one fifth or less.

Ninth Embodiment

Figure 10:
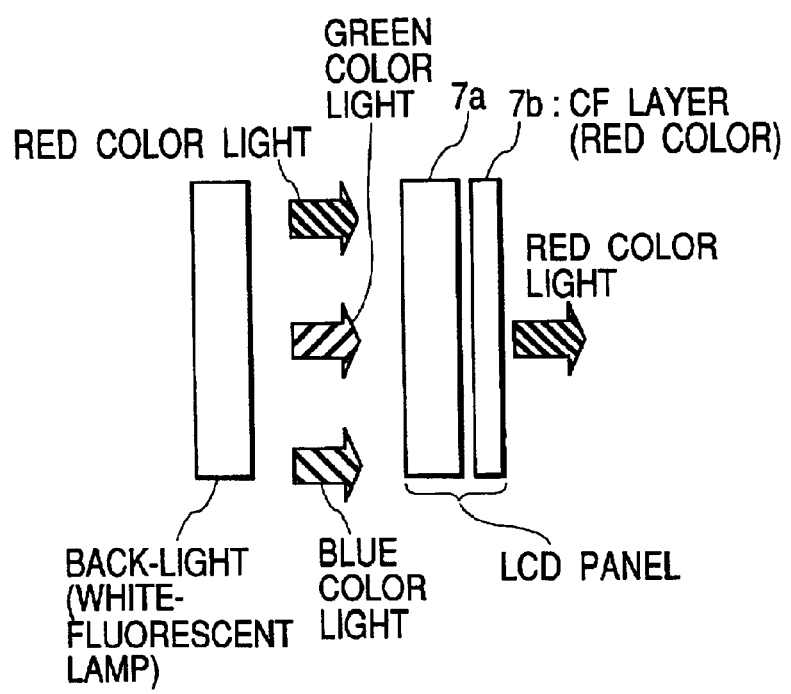
FIG. 10 is a schematic diagram showing the configuration of a white light source as another embodiment of the present invention.

The phosphor layers according to First through Eighth Embodiments were prepared by homogeneously mixing the red light emitting phosphor and the yellow-green light emitting phosphor. Accordingly, light obtained from these light sources is white light alone, and the light is then introduced into a display apparatus, is allowed to pass through, for example, a filter and thereby yields red, green and blue color light. In this configuration, the LCD panel (liquid crystal panel) includes a liquid crystal plate 7a on the side of incident light (on the left side in the figure) and a filter (CF layer) 7b on the side of outgoing light (on the right side in the figure) as shown in FIG. 10.

In contrast, a light source according to the present embodiment can emit light of an individual color. In this type of light source, a blue-fluorescent lamp is used as an excitation light generation unit, and a composition of a single-color component is applied or printed alone or compositions of plural color components are separately applied or printed, respectively.

Figure 11:
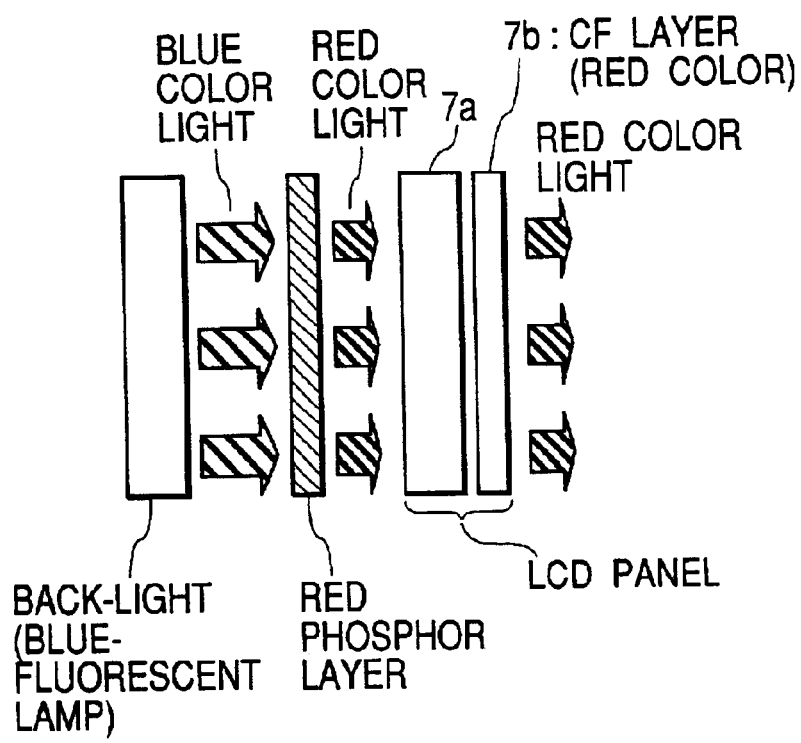
FIG. 11 is a schematic diagram showing the white light source as above, in which the excitation light generation unit is a blue-fluorescent lamp.
Figure 12:
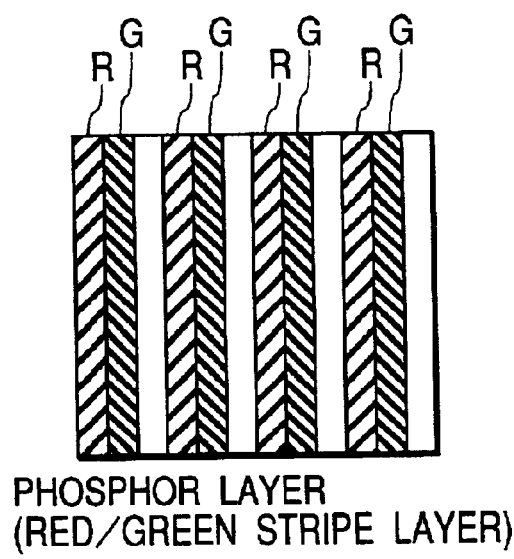
FIG. 12 is a plan view showing the configuration of a fluorescence generation unit using striped phosphor layers as an embodiment of the present invention.

In this light source, a red light emitting phosphor layer is irradiated with blue light from the blue-fluorescent lamp and thereby yields red light, and the red light is then directly supplied to a liquid crystal display (LCD panel, where the CF layer is of red color) as shown in FIG. 11. This configuration can improve light utilization factors With reference to FIG. 12, a phosphor layer sheet is prepared by alternatively forming phosphor layers (represented by R or G in the figure) each emitting red or green light respectively in the form of stripes, part of which sheet lacks the phosphor layers (indicated by white regions in the figure). The dimensions of the phosphor layer sheet are not specifically limited to the above description.

The phosphor layer sheet is then disposed as a phosphor layer between a blue-fluorescent lamp as an excitation light generation unit and a liquid crystal display and thereby yields a display apparatus. The resulting display apparatus has an improved light utilization factor, exhibits luminance degradation of red and green colors in the same manner as in that of the blue-fluorescent lamp and exhibits less color shift over a long time.

As thus described above, the present invention can increase the red color component of light sources and can provide a white light source and a display apparatus that are suitable for displaying images with high quality.

While the present invention has been described with reference to what are presently considered to be the preferred embodiments, it is to be understood that the invention is not limited to the disclosed embodiments. On the contrary, the invention is intended to cover various modifications and equivalent arrangements included within the sprit and scope of the appended claims. The scope of the following claims is to be accorded the broadest interpretation so as to encompass all such modifications and equivalent structures and functions.

What is claimed is:

1. A white light source comprising an ultraviolet-visible excitation light generation unit for generating ultraviolet light and first visible light having a wavelength of from 400 nm to 500 nm; and a fluorescence generation unit having a phosphor layer for generating second visible light upon irradiation of the ultraviolet-visible light generated from the ultraviolet-visible excitation light generation unit as excitation light, the white light source yielding white light by mixing the first visible light from the ultraviolet-visible excitation light generation unit and the second visible light from the fluorescence generation unit, wherein the phosphor layer comprises a red light emitting phosphor represented by following Compositional Formula (1):

$$(Ca_{1-a-b}Sr_aEu_b)S:M_c \quad (1)$$

wherein a, b and c satisfy the following conditions:

$$0 \leq a < 1.0,\ 0 < b \leq 0.1\ \text{and}\ 0 \leq c \leq 0.1;$$

and M is a dopant element having an absorption of excitation energy in a range from 350 nm to 500 nm.

2. The white light source according to claim 1, wherein the dopant element M in Compositional Formula (1) is at least one rare earth element selected from the group consisting of Ce, Yb, Gd and Tm.

3. The white light source according to claim 1, wherein the phosphor layer of the fluorescence generation unit further comprises, based on the total weight of phosphors constituting the phosphor layer, 40% to 80% by weight of a red light emitting phosphor represented by Compositional Formula (1) and the rest of a green light emitting phosphor represented by following Compositional Formula (3):

$$(Y_{1-a-b}Gd_aCe_b)_3(Al_{1-c}Ga_c)_5O_{12} \qquad (3)$$

wherein a, b and c satisfy the following conditions:

$$0 \leq a \leq 1.0,\ 0 < b \leq 0.1\ \text{and}\ 0 \leq c \leq 1.0.$$

4. The white light source according to claim 1, wherein the phosphor layer of the fluorescence generation unit further comprises, based on the total weight of phosphors constituting the phosphor layer, 40% to 80% by weight of a red light emitting phosphor represented by Compositional Formula (1) and the rest of a green light emitting phosphor represented by following Compositional Formula (4):

$$(Y_{1-a-b}Gd_aCe_b)_3(Al_{1-c}Ga_c)_5O_{12} \qquad (4)$$

wherein a, b and c satisfy the following conditions:

$$0 \leq a \leq 1.0,\ 0 < b \leq 0.1\ \text{and}\ 0 \leq c \leq 1.0;$$

K is contained as a dopant; and d is ppm by weight and satisfies the following condition: $0 \leq d \leq 1000$.

5. A white light source, comprising an ultraviolet-visible excitation light generation unit for generating ultraviolet light and first visible light having a wavelength of from 400 nm to 500 nm; and a fluorescence generation unit having a phosphor layer for generating second visible light upon irradiation of the ultraviolet-visible light generated from the ultraviolet-visible excitation light generation unit as excitation light, the white light source yielding white light by mixing the first visible light from the ultraviolet-visible excitation light generation unit and the second visible light from the fluorescence generation unit.

wherein the phosphor layer comprises a red light emitting phosphor represented by following Compositional Formula (1):

$$(Ca_{1-a-b}Sr_aEu_b)S:M_c \qquad (1)$$

wherein a, b and c satisfy the following conditions:

$$0 \leq a < 1.0,\ 0 < b \leq 0.1\ \text{and}\ 0 \leq c \leq 0.1;$$

and M is a dopant element having an absorption of excitation energy in a range from 350 nm to 500 nm, and wherein part of at least one of Ca and Sr in Compositional Formula (1) is substituted by Zn.

6. A white light source comprising an ultraviolet-visible excitation light generation unit for generating ultraviolet light and first visible light having a wavelength of from 400 nm to 500 nm; and a fluorescence generation unit having a phosphor layer for generating second visible light upon irradiation of the ultraviolet-visible light generated from the ultraviolet-visible excitation light generation unit as excitation light, the white light source yielding white light by mixing the first visible light from the ultraviolet-visible excitation light generation unit and the second visible light from the fluorescence generation unit, wherein the phosphor layer comprises a red light emitting phosphor represented by following Compositional Formula (2):

$$(Ca_{1-a-b}Sr_aZn_dEu_b)S:M_c \qquad (2)$$

wherein a, b and c satisfy the following conditions:

$$00 \leq a < 1.0,\ 0 < b \leq 0.1\ \text{and}\ 0 \leq c \leq 0.1,$$

M is a dopant element having an absorption of excitation energy in a range from 350 nm to 500 nm; and d satisfies the following condition: $0.01 \leq d \leq 0.1$.

7. The white light source according to claim 6, wherein the phosphor layer of the fluorescence generation unit further comprises, based on the total weight of phosphors constituting the phosphor layer, 40% to 80% by weight of a red light emitting phosphor represented by Compositional Formula (2) and the rest of a green light emitting phosphor represented by following Compositional Formula (3):

$$(Y_{1-a-b}Gd_aCe_b)_3(Al_{1-c}Ga_c)_5O_{12} \qquad (3)$$

wherein a, b and c satisfy the following conditions:

$$0 \leq a \leq 1.0,\ 0 < b \leq 0.1\ \text{and}\ 0 \leq c \leq 1.0.$$

8. The white light source according to claim 6, wherein the phosphor layer of the fluorescence generation unit further comprises, based on the total weight of phosphors constituting the phosphor layer, 40% to 80% by weight of a red light emitting phosphor, represented by Compositional Formula (2) and the rest of a green light emitting phosphor represented by following Compositional Formula (4)

$$(Y_{1-a-b}Gd_aCe_b)_3(Al_{1-c}Ga_c)_5O_{12}:K_d \qquad (4)$$

wherein a, b and c satisfy the following conditions:

$$0 \leq a \leq 1.0,\ 0 < b \leq 0.1\ \text{and}\ 0 \leq c \leq 1.0;$$

K is contained as a dopant; and d is ppm by weight and satisfies the following condition:

$$0 \leq d \leq 1000.$$

9. A white light source, comprising an ultraviolet-visible excitation light generation unit for generating ultraviolet light and first visible light having a wavelength of from 400 nm to 500 nm and a fluorescence generation unit having a phosphor layer for generating second visible light upon irradiation of the ultraviolet-visible light generated from the ultraviolet-visible excitation light generation unit as excitation light, the white light source yielding white light by mixing the first visible light from the ultraviolet-visible excitation light generation unit and the second visible light from the fluorescence generation unit.

wherein the phosphor layer comprises a red light emitting phosphor represented by following Compositional Formula (1):

$$(Ca_{1-a-b}Sr_aEu_b)S:M_c \qquad (1)$$

wherein a, b and c satisfy the following conditions:

$$0 \leq a < 1.0,\ 0 < b \leq 0.1\ \text{and}\ 0 \leq c \leq 0.1;$$

and M is a dopant element having an absorption of excitation energy in a range from 350 nm to 500 nm, and wherein the phosphor layer of the fluorescence generation unit further comprises a magnesium fluorogermanate phosphor.

10. A white light source, comprising an ultraviolet-visible excitation light generation unit for generating ultraviolet light and first visible light having a wavelength of from 400 nm to 500 nm; and a fluorescence generation unit having a phosphor layer for generating second visible light upon irradiation of the ultraviolet-visible light generated from the ultraviolet-visible excitation light generation unit as excitation light, the white light source yielding white light by mixing the first visible light from the ultraviolet-visible excitation light generation unit and the second visible light from the fluorescence generation unit, wherein the phosphor layer comprises a red light emitting phosphor represented by following Compositional Formula (1):

$$(Ca_{1-a-b}Sr_aEu_b)S:M_c \qquad (1)$$

wherein a, b and c satisfy the following conditions:

$$0 \leq a < 1.0,\ 0 < b \leq 0.1\ \text{and}\ 0 \leq c \leq 0.1;$$

and M is a dopant element having an absorption of excitation energy in a range from 350 nm to 500 nm, and wherein the phosphor layer of the fluorescence generation unit further comprises an $Al_2O_3$:Cr phosphor.

11. A white light source comprising:

a fluorescence generation unit having a phosphor layer and being for generating visible light; and an excitation light generation unit for irradiating the phosphor layer with excitation light and allowing the phosphor layer to generate visible light, wherein the excitation light generation unit comprises a blue-light discharge lamp, wherein the phosphor layer of the fluorescence generation unit comprises a phosphor layer comprising a red light emitting phosphor represented by following Compositional Formula (1):

$$(Ca_{1-a-b}Sr_aEu_b)S:M_c \qquad (1)$$

wherein a, b and c satisfy the following conditions:

$$0 \leq a < 1.0,\ 0 < b \leq 0.1\ \text{and}\ 0 \leq c \leq 0.1;$$

and M is a dopant element having absorption of excitation energy in a range from 350 nm to 500 nm, and wherein the phosphor layer comprises the red light emitting phosphor layer and a green light emitting phosphor layer separately disposed adjacent to each other.

12. A display apparatus having a light source,
the light source comprising:
a fluorescence generation unit having a phosphor layer and being for generating visible light; and
an excitation light generation unit for irradiating the phosphor layer with excitation light and allowing the phosphor layer to generate visible light, wherein the light source comprises a white light source comprising an ultraviolet-visible excitation light generation unit for generating ultraviolet light and first visible light having a wavelength of from 400 nm to 500 nm; and a fluorescence generation unit having a phosphor layer for generating second visible light upon irradiation of the ultraviolet-visible light generated from the ultraviolet-visible excitation light generation unit as excitation light, the white light source yielding white light by mixing the first visible light from the ultraviolet-visible excitation light generation unit and the second visible light from the fluorescence generation unit, wherein the phosphor layer comprises a red light emitting phosphor represented by following Compositional Formula (1):

$$(Ca_{1-a-b}Sr_aEu_b)S:M_c \qquad (1)$$

wherein a, b and c satisfy the following conditions:

$$0 \leq a < 1.0,\ 0 < b \leq 0.1\ \text{and}\ 0 \leq c \leq 0.1;$$

and M is a dopant element having absorption of excitation energy in a range from 350 nm to 500 nm.

13. The display apparatus according to claim 12, comprising a display panel, the light source and control means for controlling visible light irradiated by the light source to thereby display an image on the display panel, wherein the light source has control means for controlling a change in emission intensity of one of red, green and blue light with time to thereby control changes in emission intensities of the red, green and blue light with time.

14. A display apparatus having a light source, the light source comprising a fluorescence generation unit having a phosphor layer and being for generating visible light; an excitation light generation unit for irradiating the phosphor layer with excitation light thereby allowing the phosphor layer to generate visible light; a white light source; and control means for controlling a change in emission intensity of the blue light emission of a blue-light discharge lamp constituting the excitation light generation unit of the white light source to thereby control changes in emission intensities of red, green and blue light with time, wherein the phosphor layer of the fluorescence generation unit comprises a phosphor layer comprising a red light emitting phosphor represented by following Compositional Formula (1):

$$(Ca_{1-a-b}Sr_aEu_b)S:M_c \qquad (1)$$

wherein a, b and c satisfy the following conditions:

$$0 \leq a < 1.0,\ 0 < b \leq 0.1\ \text{and}\ 0 \leq c \leq 0.1;$$

and M is a dopant element having absorption of excitation energy in a range from 350 nm to 500 nm, and wherein the phosphor layer comprises the red light emitting phosphor layer and a green light emitting phosphor layer separately disposed adjacent to each other.

* * * * *